(12) United States Patent
Husted et al.

(10) Patent No.: US 7,982,549 B1
(45) Date of Patent: Jul. 19, 2011

(54) DUAL SELF-CALIBRATING LOW-POWER OSCILLATOR SYSTEM AND OPERATION

(75) Inventors: Paul J. Husted, San Jose, CA (US); Manev Luthra, Santa Clara, CA (US); Wen-Hsing Chen, San Jose, CA (US)

(73) Assignee: Atheros Communications, Inc., San Jose, CA (US)

( * ) Notice: Subject to any disclaimer, the term of this patent is extended or adjusted under 35 U.S.C. 154(b) by 39 days.

(21) Appl. No.: 12/630,931

(22) Filed: Dec. 4, 2009

(51) Int. Cl.
    H03L 1/00 (2006.01)
    H03L 1/02 (2006.01)
(52) U.S. Cl. .............. 331/175; 331/44; 331/46; 331/57; 331/143; 331/176
(58) Field of Classification Search ............... 331/44, 331/46, 57, 65, 66, 111, 143, 175, 176
See application file for complete search history.

(56) References Cited

U.S. PATENT DOCUMENTS 7,508,246 B2 *  3/2009  Kase et al. .................. 327/261

* cited by examiner

Primary Examiner — David Mis
(74) Attorney, Agent, or Firm — Meyertons Hood Kivlin Kowert & Goetzel, P.C.; Jeffrey C. Hood

(57) ABSTRACT

A system may include a first circuit configured to generate a first clock having a first period of oscillation, and a second circuit configured to generate a second clock having a second period of oscillation, where the difference ($\Delta T$) between the first period of oscillation and the second period of oscillation remains within a specified limit even during variations in temperature and/or during variations in the supply voltage. The system may further include a control circuit, which may receive the first clock and the second clock, and adjust, according to $\Delta T$, a first target parameter corresponding to a first number of cycles of the first clock, when a current cycle count of the second clock reaches a second target parameter corresponding to a second number of cycles of the second clock. The control circuit may also adjust, according to $\Delta T$, the second target parameter when the current cycle count of the second clock reaches the second target parameter, and generate, based on counted cycles of the second clock, an output clock having an output period higher than the first period and the second period.

20 Claims, 6 Drawing Sheets

DUAL SELF-CALIBRATING LOW-POWER OSCILLATOR SYSTEM AND OPERATION

BACKGROUND OF THE INVENTION

1. Field of the Invention

This invention relates to oscillator design, and, more particularly, to the design of more accurate low-power oscillators.

2. Description of the Related Art

Wireless protocols like Bluetooth and WLAN (wireless local area network) make provisions for the devices to be placed in sleep mode, but such devices must typically maintain a clock with some amount of accuracy, for example 250 ppm (parts per million) for Bluetooth. Typically, this can be achieved using an external 32 KHz sleep clock, but this adds expense if the crystal doesn't already exist in the system, or if it's hard to route the clock to the device. An internal low power oscillator (LPO) may be designed on-chip, but the oscillation frequency of the LPOs may change as voltage and temperature drift. With careful design, this change may only be a few percent across the entire temperature range, but in terms of ppm 1% may equal 10,000 ppm. In standard CMOS, without a crystal, it is generally difficult to achieve the 250 ppm goal with a single oscillator.

Oscillators are typically electronic circuits that convert energy from direct-current sources into periodically varying electrical signals, or voltages. That is, an oscillator typically operates by utilizing the electrical behavior of its circuit elements to convert a steady state input signal into a periodic, time variant output signal. In some implementations the signal produced by an oscillator may be sinusoidal in appearance, such as a sine wave, in other implementations it may appear as a square wave, triangular wave, or a variety of other repeatable signals. As mentioned above, many of today's integrated circuits that require oscillators, such as timer circuits, need to include the oscillators on-chip in order to meet cost and area requirements. The behavior of such on-chip oscillators is typically affected by the technology used to fabricate the integrated circuit, temperature changes, and supply voltage changes. For example, many widely used fabrication processes today are based on complementary metal-oxide-semiconductor (CMOS) technology, where each specific qualified CMOS process varies slightly from another, and parts manufactured within a given specific qualified CMOS process also vary with respect to each other, within certain tolerances.

One common type of oscillator is the relaxation oscillator. Typically a relaxation oscillator achieves its oscillating output by charging a capacitor to some event or switching threshold. The event discharges the capacitor, and its recharge time determines the repetition time of the events or switching. Similarly, an oscillating output could also be achieved by discharging instead of charging the capacitor to reach the event or switching threshold. Typically the capacitor is charged through a resistor, with the values of the resistor and the capacitor, which define an RC time constant, determining the rate, or frequency, of the oscillation. For example, decreasing the value of the resistor may increase the oscillation frequency, and increasing the value of the resistor may decrease the oscillation frequency. Typical relaxation oscillators whose frequency is determined by an RC time constant may be prone to temperature and voltage supply variations, since the resistor(s) and capacitor(s) (corresponding to the RC time constant) are temperature dependent, as well as supply dependent with the amplitude of the signals typically affecting the oscillator frequency.

Since the accuracy of the oscillator may determine the proper functionality of the integrated circuit or system in which the oscillator is configured, it is important to ensure that the frequency (or period) of oscillation does not fall outside certain required limits with temperature and/or supply voltage variations. Other corresponding issues related to the prior art will become apparent to one skilled in the art after comparing such prior art with the present invention as described herein.

SUMMARY OF THE INVENTION

In one set of embodiments, in order to decrease the temperature sensitivity of an oscillator output, two oscillators may be configured with identical comparators and logic circuitry, but having different oscillation frequencies. The difference between the respective periods of oscillation of the two oscillators may therefore become independent of the comparator delay. In one set of embodiments, the output of one oscillator may be used to calibrate the output of the other oscillator, due to the difference between the respective periods of oscillation of the two oscillators remaining independent of variations in temperature.

A single oscillator system may include many different components that do not necessarily correlate with each other. For example, logic and comparator delay, and delays due to RC may not correlate with each other. By using two oscillators, the error contribution by most of the parameters that change with respect to temperature may be eliminated, leaving only the temperature sensitivity of the resistors as a contributing factor. The temperature coefficient of the entire LPO (low-power oscillator) circuit may therefore become more predictable, and more controllable. The output of one LPO may be used as the desired oscillator CLK output, while the output of the other LPO may be used to accurately correct that output as it is changing with temperature.

Frequency stability of the oscillator may therefore be established with respect to temperature, through establishing and using a temperature-stable difference in frequency (or difference in period) between the two LPO outputs. In other words, the difference between a clock output of a first LPO and a clock output of a second LPO may be temperature independent. The architecture of both LPOs may be the same, and both LPOs may be configured with identical components, with the exception of two respective divider resistors, which may be used to adjust the oscillation frequency of the LPO. The temperature stable difference in oscillation frequency between the two LPOs may then be used for a variety of purposes. For example, it may be used to implement stable low-frequency timekeeping.

Power consumption may be reduced such that the two oscillators consume less power together than a single oscillator optimized through prior art methods. Benefits also include relaxed requirements for certain circuit elements. The different output periods may be obtained by moving the threshold on the reference input to the comparator configured in the LPO, as opposed to having different input capacitor and feedback resistor values for the two oscillators. In other words, the value of the feedback resistor (to the oscillator input) may be the same for both oscillators, and the value of the input capacitor may be the same for both oscillators, while the two oscillators have different oscillation periods (frequencies). This may result in the comparators triggering differently, and the difference in period between the two LPO output signals may be obtained by changing the effective value of the reference node of the comparator, thereby causing the two comparators to flip at different times with respect to each other.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
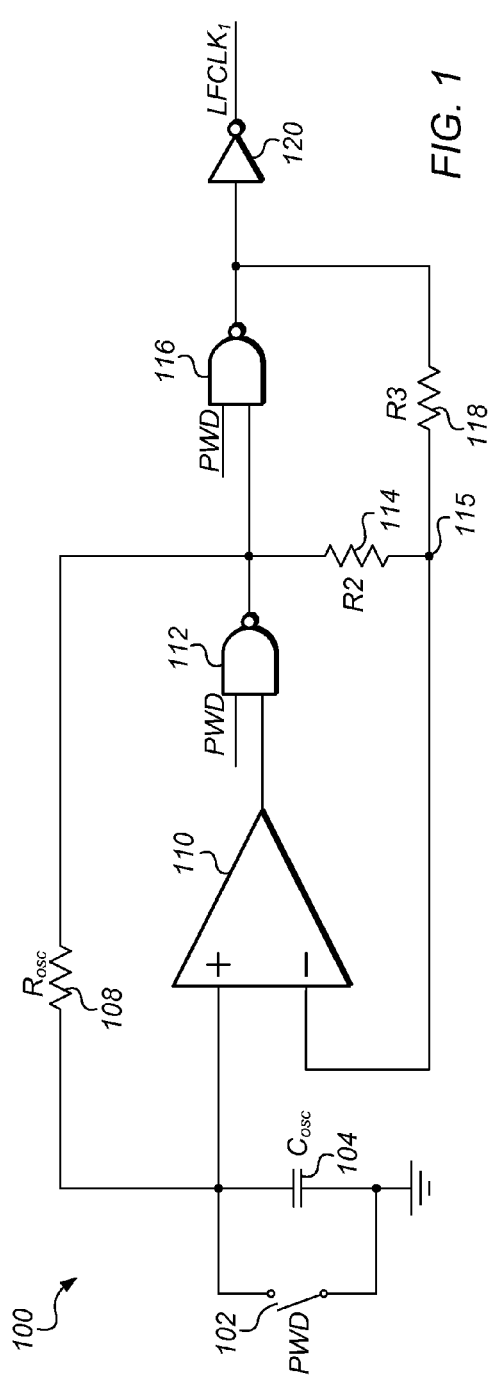
FIG. 1 shows the circuit diagram of one embodiment of a first oscillator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION

In various embodiments, two low-frequency/low-power oscillators configured in a two-oscillator system may be used for tracking time, for example during sleep mode of a system or an integrated circuit (chip). The two-oscillator system may be operated during normal mode to indicate to the chip when to wake up, and may also be operated to provide timing in case the chip wakes up due to an external interrupt. In some embodiments, the two-oscillator system may also provide a clock—of possibly different frequency than the frequency during normal operation—during sleep mode. The maximum allowed frequency drift of the oscillators over time may be determined by the maximum allowed time-error during the wake up time.

One possible design of a low power oscillator (LPO) 100 is shown in FIG. 1. LPO 100 may be manufactured using a specified process technology, which may be a 0.13 μm technology process in one set of embodiments. In another set of embodiments, LPO 100 may be manufactured using a 65 nm technology process, while the temperature sensitivity of LPO 100 may also be improved by at least a factor of two, as will be further shown below. In most prior art designs, a tradeoff has to be made between power consumption and the stability of the oscillation frequency with respect to temperature. In other words, the oscillation frequency may change as the system/chip temperature changes, and an increase in stability of the oscillation frequency over changing temperature would require higher power consumption. Conversely, lower power consumption would result in less stable oscillation frequency over changing temperatures. In one set of embodiments, a new LPO system may facilitate increased stability of the oscillation frequency of the desired periodic signal output without increasing the power consumption of the LPOs configured in the LPO system.

Referring again to FIG. 1, LPO 100 may be built around a comparator 110 having a reference input 115 based on the unbuffered output of LPO 100, which may be passed through inverter 120 to provide the clock output $LFLCK_1$ of LPO 100. In one set of embodiments, a switch 102 may be operated using a signal PWD (powered-on), enabling LPO 100 when the PWD signal is deasserted. When asserted, PWD signal may also operate to force the output $LFLCK_1$ of LPO 100 to a set value via NAND gates 112 and 116. When PWD is deasserted, NAND gates 112 and 116 may each operate as inverters. When PWD is asserted, the respective outputs of NAND gates 112 and 116 are held low, setting the output $LFLCK_1$ high. Alternate embodiments may be configured with different circuitry to power-on/reset the oscillator. The oscillation frequency of LPO 100 may be a function of the $R_{osc}C_{osc}$ time constant, with resistor 108 and capacitor 104 configured as shown. The oscillation frequency may further be a function of the configuration logic delay ($T_{Logic}$) and comparator delay ($T_{Comp}$). The time period ($T_{osc}$) corresponding to the oscillation frequency of LPO 100 may be expressed as:

$$T_{osc}=2T_{Comp}+2T_{Logic}+aR_{osc}C_{osc}, \quad (1)$$

where 'a' is a function of low and high reference voltages seen at reference node 115 of comparator 110, and generated by the resistor divider comprising resistors 114 and 118. The temperature coefficient of LPO 100 may be a function of temperature sensitivity of all these delays. The logic delay may constitute a small part of the overall delay. However, the delay in comparator 110, and the resistor values may all change with temperature, and may consequently change the frequency of oscillation. In order to decrease the overall temperature dependency, the power of the comparator may be increased to speed up the comparator and decrease its overall delay contribution. For example, from a total of 14 μA of current for a typical process corner case for LPO 100, 12 μA may be consumed in the comparator to achieve this goal. Temperature sensitivity of −300 ppm/C to 250 ppm/C (where 'ppm' stands for 'parts per million') may be achieved over different process corners.

Temperature Sensitivity of Different Components

Different process technologies may result in different temperature coefficients of nPoly and pPoly resistors. The overall resistance may be expressed as:

$$R=R_0(1+T_{C1}(T-T_0)+T_{C2}(T-T_0)^2), \text{ where } T_{C1}<<T_{C2}, \quad (2)$$

where $R_0$ is the initial resistance, $T_0$ is the initial temperature, and $T_C$ corresponds to the temperature coefficient. For example, in a 65 nm process, the resistors may cause around 150 ppm per degree C. change in oscillator frequency, or they may cause less change if the nPoly and pPoly resistors were combined. If the delay of comparator 110 changes in the same direction over temperature as that of the resistor(s), the sensitivities may add together, and may therefore increase the overall sensitivity. However, if they change in the opposite direction, they may cancel each other out and improve the overall temperature sensitivity. A metal capacitor (i.e. a capacitor structure configured using metal layers) may remain stable with respect to temperature. Temperature sensitivity of MOS capacitors is typically small. For example, simulations may indicate around 70 ppm per degree change in core device MOS capacitors, and −120 ppm per degree change in native-io MOS capacitors. The temperature sensitivity of comparator 110 may depend on the change in threshold and mobility of nMOS and pMOS transistors in the specific technology in which comparator 110 has been manufactured. It may also depend on the comparator bias voltage.

Two-Oscillator Design Methodology

Figure 2:
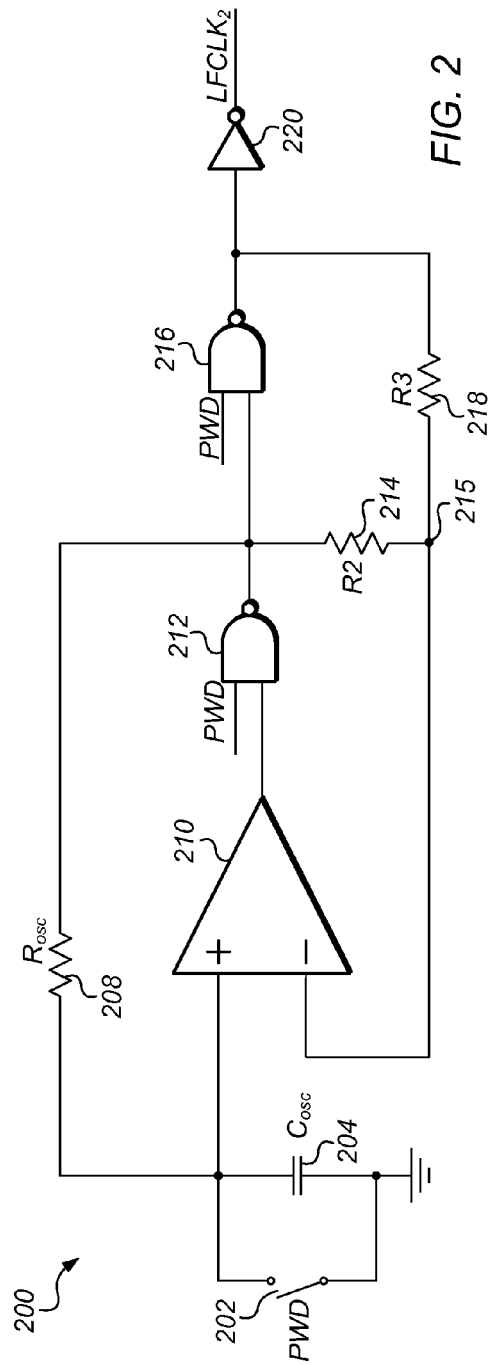
FIG. 2 shows the circuit diagram of one embodiment of a second oscillator that can be used with the first oscillator in a two-oscillator system.
Figure 4:
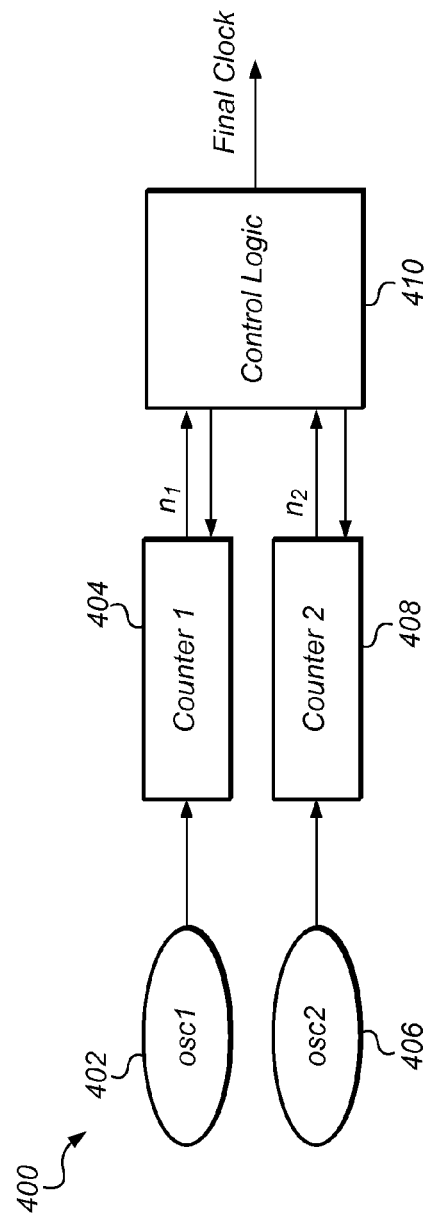
FIG. 4 shows a system diagram of one embodiment of a two-oscillator system that may include the first oscillator and the second oscillator.

When considering an oscillator such as LPO 100, the bottleneck in reducing temperature sensitivity and power consumption may be identified as comparator 100. In order to decrease temperature sensitivity, two oscillators may be configured with the same comparator and same logic circuitry, but having different oscillation frequencies. In other words, the core circuitry of both oscillators may be the same, while the respective periodic output signal generated by each of the oscillators may have a different period of oscillation. In this way, the difference in the oscillation period of the two oscillators may be independent of the comparator delay. FIG. 2 shows a second LPO 200, which may be identical to LPO 100 with the exception of the value of resistors R2 and R3, represented as resistors 114 and 118, respectively, in LPO 100, and resistors 214 and 218, respectively, in LPO 300. The choice of the values for resistors R2 and R3 in each LPO will be further discussed below. FIG. 4 shows a system diagram of one embodiment of a two-oscillator system, or dual-oscillator system, 400 where oscillators 402 and 406 may be used to operate counters 404 and 408, respectively, with oscillator 402 having a different oscillation frequency than oscillator 406, while both oscillators may be constructed using identical comparators and logic circuitry. Dual-oscillator system 400 may also include control logic 410, which may be used to generate a final periodic signal (clock signal) output, which may have a period of oscillation that is substantially independent of variations in temperature, or may only vary within specified limits as the temperature changes.

The respective time periods corresponding to the respective oscillation frequencies of LPO 100 (referenced by subscript '1') and LPO 200 (referenced by subscript '2') may be expressed by the following equations:

$$T_1 = T_{osc1} = aR_{osc}C_{osc} + 2T_{comp} + 2T_{Logic} \quad (3)$$

$$T_2 = T_{osc2} = bR_{osc}C_{osc} + 2T_{comp} + 2T_{Logic}. \quad (4)$$

The difference between the two periods may then be expressed as:

$$\Delta T = (T_1 - T_2) = (a-b)R_{osc}C_{osc}. \quad (5)$$

Assuming the capacitor value ($C_{osc}$) is fairly constant, temperature sensitivity of $\Delta T$ (i.e. the temperature sensitivity of the difference between the period of oscillation of LPO 100 and LPO 200) may track the temperature sensitivity of the resistors ($R_{ose}$). As long as the comparator has the same delay in both oscillators—i.e., comparator 110 has the same delay as comparator 210—its stability with temperature or its delay contribution may become unimportant. Therefore, this method may significantly reduce the requirements on comparators 110 and 210, and low-speed, low-power comparators may be used for comparators 110 and 210. In one set of embodiments, the respective architectures of comparator 110 and 210 may be the same to ensure the logic delay and the comparator delay is the same for both comparators. This may result in a fairly constant period difference $\Delta T$, which may then be used to track the output of at least one of the oscillators or both oscillators, ensuring that the oscillation frequency of the tracked output remains substantially constant with respect to temperature, or does not fall outside a specified value range with changing temperature. Various embodiments may be configured with different methods to use the constant $\Delta T$ to generate a stable frequency output based on the respective output clocks of LPO 100 and LPO 300.

In other words, a single oscillator system may include many different components that do not necessarily correlate with each other. E.g., logic and comparator delay, and delays due to RC may not correlate with each other. By using two oscillators, the error contribution by most of the parameters that change with temperature may be eliminated, and only resistor sensitivity may need to be accounted for. The temperature coefficient of the entire two-LPO circuit may therefore become more predictable, and more controllable (lower sensitivity). The output of the dual-LPO system may be derived from the CLK output of one LPO, while the CLK output of the other LPO may be used to correct the output of the dual-LPO system as it is moving with temperature.

Circuit Design of Two Oscillators

Figure 3:
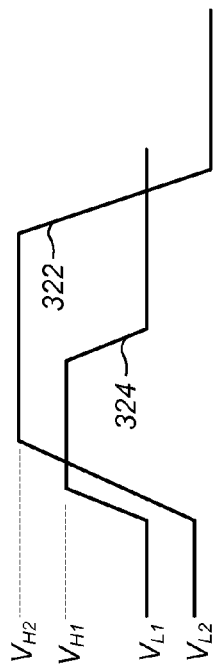
FIG. 3 shows voltage diagrams representative of the respective reference-node voltages of the comparators in the first oscillator and the second oscillator, according to one embodiment.

While the respective oscillation frequency of each LPO (LPO 100 and LPO 200) may be primarily determined by the respective values of $R_{osc}$ and $C_{osc}$, in order to maintain the same logic design in both LPOs, different oscillation frequencies for the two LPOs may be generated by providing different reference voltages at the respective reference nodes of comparators 110 (node 115) and 210 (node 215), using different resistor divider ratios. Thus, in LPO 100 the values of R2 (114) and R3 (118) may be different than the values of R2 (214) and R3 (218) in LPO 200. In one set of embodiments, comparators 110 and 210 may be designed to not be sensitive to the common mode voltage of the input, having a constant delay for different reference voltages. FIG. 3 shows one example of the reference voltages 324 and 322 that may be generated at reference inputs 115 and 215, respectively, for LPO 100 and LPO 200. As an example, LPO 100 may be configured as a higher frequency oscillator, with R2 (114) having a value of 9R, and R3 (118) having a value of 10R (R representing a specified unit resistance value), with a low reference voltage threshold of 570 mV ($V_{L1}$) and a high reference voltage threshold of 630 mV ($V_{H1}$) as shown in reference voltage waveform 324. On the other hand, LPO 200 may be configured as a lower frequency oscillator, with R2 (214) having a value of 8R, and R3 (218) having a value of 11R (R again representing the specified unit resistance value), with a low reference voltage threshold of 500 mV ($V_{L2}$) and a high reference voltage threshold of 700 mV ($V_{H2}$) as shown in reference voltage waveform 322.

The comparator in both LPOs may be configured overall to work with an input common mode range of 500 mV to 700 mV. It should be noted that increasing $R_{osc}$ and/or $C_{osc}$ may not be a desirable or preferred method to change the frequency of either oscillator, since the slope of one output signal (e.g. LFCLK$_1$) may be different from the slope of the other (e.g. LFCLK$_2$), in which case the delay contribution of the comparator would be different. Since the comparator may be configured with a low-speed architecture, such difference would become significant and the speed could not be increased without increasing power consumption. Hence, the oscillation frequency of each LPO may be determined/specified by the respective values of the respective R$_{osc}$ and C$_{osc}$ of the LPO, plus the respective values of the respective resistors R2 and R3 of the LPO, where the respective R$_{osc}$ and C$_{osc}$ values of LPO 100 are the same as the respective R$_{osc}$ and C$_{osc}$ values of LPO 200.

Comparators

In one set of embodiments, each oscillator may be configured with a clockless, low-power comparator. A variety of different gain stages may be considered for comparators 110 and 210, and various factors may be taken into consideration when designing comparators 110 and 210. One factor may be good DC common-mode rejection. Since the reference voltage (voltages at nodes 115 and 215, respectively) may change over a wide range (e.g. from 500 mV-700 mV), low-threshold transistors may be used. The length of tail current source may also affect the common-mode rejection. While schematic simulations provide a positive indication for a length of 1 μm for a tail current source, the indication provided by LPE (low-pass equivalent) simulations is not similarly positive at certain process corners. In one set of embodiments, the width and length of the current source may be doubled to improve the results. Furthermore, the comparator may be configured such that as long as the offset is constant with temperature, the first order static offset of the comparator may not affect the results. The (transistor) devices may therefore be sized to be large enough that the sigma of offset is less than a specified value, for example less than 5 mV in some embodiments.

Figure 5A:
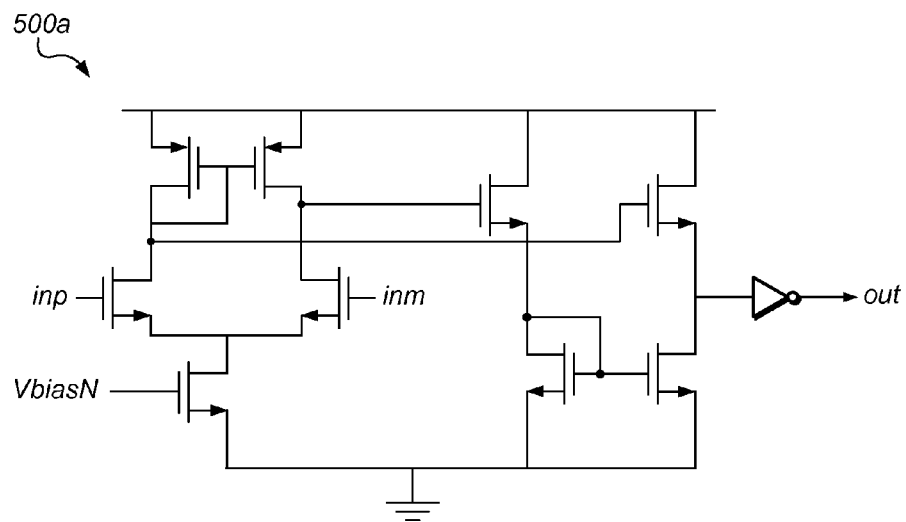
FIGS. 5A and 5B show transistor diagrams of two different comparator architectures that may be used for embodiments of the comparators in the first oscillator and the second oscillator.
Figure 5B:
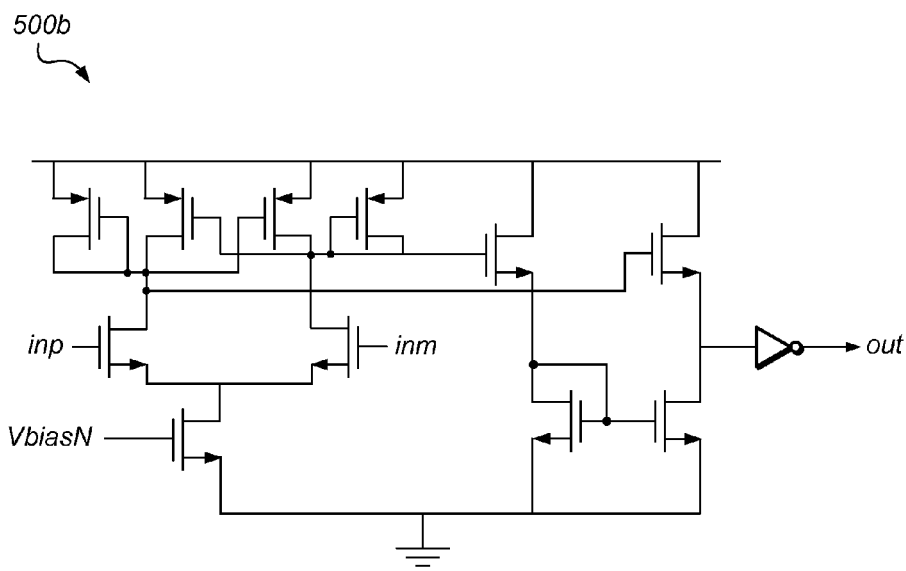

An important factor in designing the gain stages in the comparator may be power consumption. When the current of each stage is expected to be low, simple resistor loads may not be sufficient, since resistors on the order of MΩ may be required for generating currents in the μA current range. Similarly, using an active PMOS load, and resistors between their gate and drain for biasing, may require a few hundred KΩ resistors to provide gain. FIGS. 5A and 5B show two possible comparator architectures 500a and 500b, respectively. In each case, 'inp' corresponds to the non-inverting node (e.g. the oscillator nodes of comparators 110 and 210), and 'inm' corresponds to the inverting node (e.g. the reference nodes of comparators 110 and 210). From comparator architecture 500a and comparator architecture 500b, comparator architecture 500b may be identified as being more efficient, since it is more symmetric and may provide better supply rejection. The first order supply rejection may be zero since the variation would be common between LPO 100 and LPO 200 (or, specifically, between comparator 110 and comparator 210). Thus, while both comparator architectures 500a and 500b represent low-power comparators suitable for implementing the two-LPO design, comparator 540b may be more effective in achieving the desired goals due to its symmetry and better supply rejection.

Biasing Circuitry

Figure 6A:
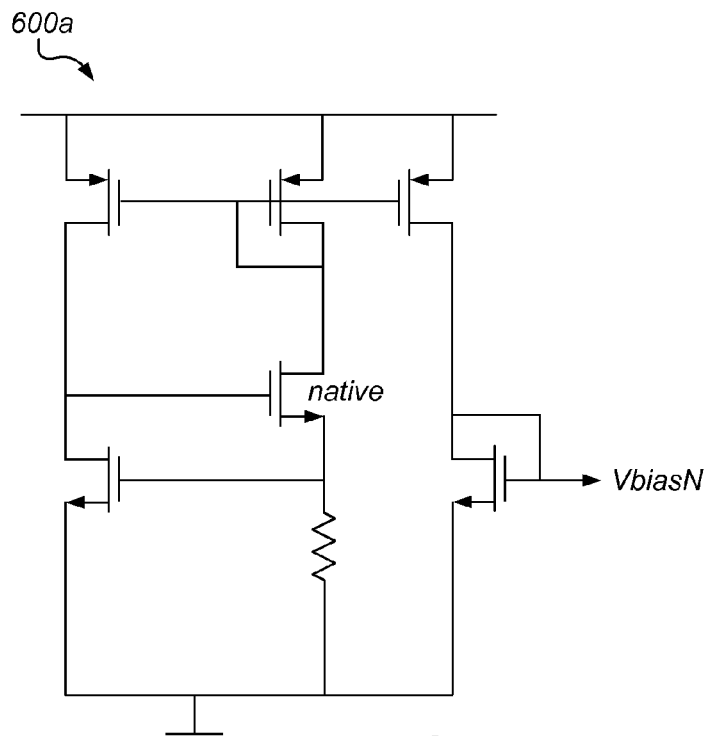
FIGS. 6A and 6B show transistor diagrams of two different embodiments of a biasing circuit that may be included in the comparators in the first oscillator and the second oscillator.
Figure 6B:
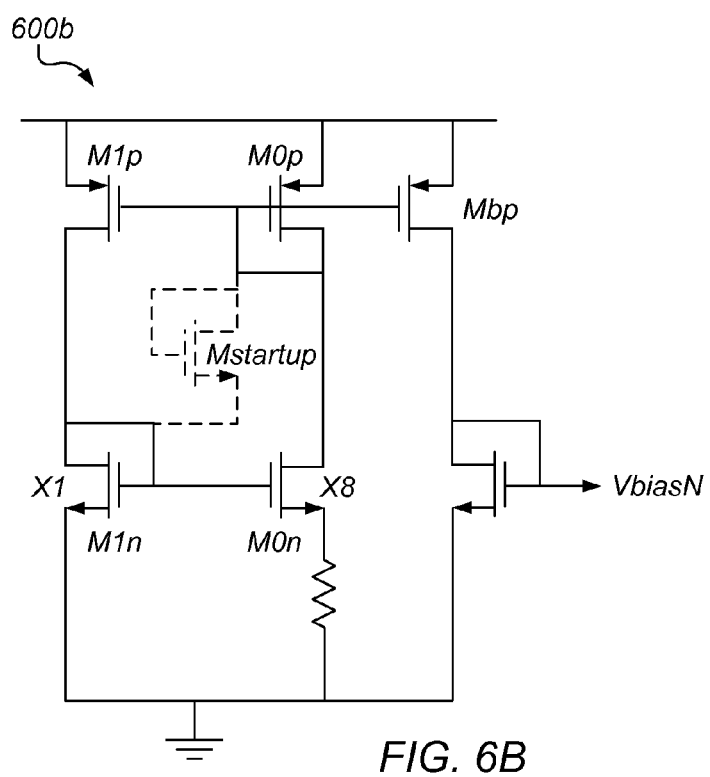

The circuits of LPO 100 and LPO 200 may be designed to be self-biasing, since they may operate even when the rest of the integrated circuit/chip (on which they may be configured) is off. One particular advantage of the two-oscillator approach presented herein is the independence of the temperature sensitivity of ΔT from the comparator performance and the biasing circuitry. The sensitivity of T1 (period of oscillation of LFCLK$_1$ of LPO 100) and T2 (period of oscillation of LFCLK$_2$ LPO 200) may change significantly with the biasing circuit. FIGS. 6A and 6B show two different embodiments (600a and 600b) of possible biasing circuits. The biasing output VbiasN corresponds to the VbiasN input shown in comparator circuits 500a and 500b. Biasing circuit 600a (V$_{gs}$/R biasing circuit) may provide good temperature dependency for ΔT, but it may result in less than ideal temperature sensitivities for T1 and T2. In order to improve the performance of each oscillator, biasing circuit 600b (constant-gm biasing circuit) shown in FIG. 6B may be used. By configuring the comparators with biasing circuit 600b, the respective temperature sensitivities of T1 and T2 may be reduced, while still operating with low power consumption. In one embodiment, biasing circuit 600b is configured with a start up circuit. As shown in FIG. 6B, transistor Mstartup may operate as the startup circuitry. The bias current may be determined by equation (Vgs1$n$=Vgs0$n$+RI), which may feature two stable currents, a zero current and a non-zero current. The startup circuit may prevent the zero current by providing an additional current path through Mbp and M1$n$. When the current increases, it may reach the second stable point, and the startup transistor Mstartup may turn off Biasing circuit 600b may be configured to meet the following two conditions:

$$V_{dd}-V_{gs\_M0p}-V_{gs\_M1n} \leq V_{th\_Mstartup} \quad (6)$$

$$V_{th\_M0p}+V_{th\_Mstartup}+V_{th\_M1n} \leq V_{dd}.$$

The resistor types may be selected according to the given process technology that will be used for fabricating LPO 100 and LPO 200. For example, for a given TSMC (Taiwan Semiconductor Manufacturing Company) technology, nPoly resistors may be used because of their lower temperature sensitivity. Because in this technology nPoly and pPoly temperature coefficients may have opposite signs, a combination of nPoly and pPoly resistors may be used to achieve lower overall temperature sensitivities. One important parameter in selecting the oscillation capacitor may be the voltage sensitivity. Regular MOS capacitors may be overly sensitive to temperature variation. Using native MOS capacitors may reduce sensitivity to temperature variation, and using metal capacitors may further reduce sensitivity to temperature variation. The tradeoff may be the area of the metal capacitors. The effect of capacitance may be measured by configuring the first LPO (e.g. LPO 100) using native-io capacitors, and configuring the second LPO (e.g. LPO 200), which is otherwise identical to the first LPO, using metal capacitors, and contrasting the behavior of the first LPO and the second LPO.

Divider resistors R2 and R3, and the input capacitor (C$_{osc}$) of the comparator may determine the settling time of the reference point (115 in LPO 100 and 215 in LPO 300). This time may be specified to be small enough for the reference node to settle down before the oscillator node (the non-inverting input into the comparator) approaches the reference voltage. On the other hand, use of small resistors may be limited by power constraints. 1 MΩ resistors may result in 1.2 μA currents. The desired settling time may be achieved by reducing the size of the input capacitor of the comparator.

Adjusting the Output of One Oscillator Using the Output of the Other Oscillator

As mentioned above, the two-oscillator design disclosed herein may result in a stable ΔT (difference between the respective oscillation periods of the two LPOs) instead of a directly stable oscillation period T. Therefore, ΔT may be used to estimate time, enabling the use of the output of one LPO to calibrate or adjust the output of the other LPO. For example, the desired oscillator output may be based on LFCLK$_1$, and LFCLK$_2$ may be used to calibrate/adjust LFCLK$_1$. In one set of embodiments, the two-oscillator system shown in FIG. 4 may include control circuitry shown in FIG. 7 that may be configured to use LFCLK$_2$ to adjust LFCLK$_1$ based on ΔT, and/or use LFCLK$_1$ to adjust LFCLK$_2$ based on ΔT. In certain embodiments, a final output clock may be generated by counting cycles of LFCLK$_1$, using LFCLK$_2$ to adjust the number of times cycles of LFCLK$_1$ are counted, to generate the final output clock. Similarly, the final output clock may be generated by counting cycles of LFCLK$_2$, using LFCLK$_1$ to adjust the number of times LFCLK$_2$ is counted to generate the final output clock. It should be mentioned again, that components 102, 104, 108, 110, 112, 116, and 120 in LPO 100 may be configured to be identical to the corresponding components 202, 204, 208, 210, 212, 216, and 220 in LPO 200. Those skilled in the art will appreciate that references to "identical components" are made with respect to designing components with the intent of the components being identical, and that some slight, though possibly negligible differences between the actual fabricated components may exist within acceptable margins. The threshold of the voltages at the respective reference nodes 115 and 215 may be moved by selecting the values of resistors R2 and R3 (114 and 214, and 118 and 218, respectively), to achieve different oscillation periods for LPO 100 and LPO 200, while keeping resistors 108 and 208 at the same value, and keeping capacitors 104 and 204 at the same value.

Assuming the target count for a target wake up time is called $n_{1target}$ and $n_{2target}$, the following equations may be written:

$$n_{1target} \times T_1 = t \qquad (8)$$

$$n_{2target} \times T_2 = t \qquad (9)$$

$$n_{2target} \times (T_2 + dT_{error}) = n_{2target}T_2 + n_{2target}dT_{error} = t + t_{error} \qquad (10)$$

$$n_1 = (t + t_{error})/(T_1 + dT_{error}) => (n_{1target} + dn_1) \times (T_1 dT_{error}) = t + t_{error} \qquad (11)$$

$$(n_{1target} \times T_1 + d_{n1} \times T_1 + n_{1target} \times dT_{error} + dn_1 \times dT_{error}) = t + t_{error} \qquad (12)$$

$$(dn_1 \times T_1 + n_{1target} \times dT_{error} + dn_1 \times dT_{error}) = t_{error} = n_{2target} \times dT_{error} \qquad (13)$$

$$dT_{error} \times (n_{2target} - n_{1target} - dn_1) = dn_1 T_1$$

Based on the above equations, when $n_2 = n_{2target}$, the error in time may be calculated based on $n_1$, $n_{1target}$ and $T_1$. This may be used as the basis for an algorithm in which both oscillators may be running, and the output of LPO 300 may be used to correct the output of LPO 100 for a subsequent (next) period, or similarly, the output of LPO 100 may be used to correct the output of LPO 300 for a subsequent (next) period.

Advantage and Application of a Dual-LPO System

One possible application of the two-oscillator system may be to supply time slots in a Bluetooth system. Bluetooth is a TDMA system, utilizing 625 μs time slots. The Bluetooth specification requires that a Bluetooth master device keep the time slots accurate to within 20 ppm during active operation, allowing the Bluetooth slave devices to properly follow it. This may be accomplished by using a crystal or external clock guaranteed to be within 20 ppm. However, during sleep mode it may be advantageous to power down the crystal oscillator and use an LPO instead to generate the clock signal, in order to save power. The Bluetooth specification allows for this, with a relaxed accuracy requirement of 250 ppm during sleep time, with an allowed ±10 μs jitter at wakeup time.

Prior to entering sleep mode, the system may initiate a calibration of the LPO frequency using a high-speed clock, which may be configured on the chip, e.g. a 96 MHz clock. During this calibration, cycles of the high-speed (e.g. 96 MHz) clock may be counted for a fixed number of LPO cycles. The count thereby obtained may be stored to a register. The ratio of the number of high-speed clock cycles and the number of LPO clock cycles may be used to determine the speed of the LPO clock. In one set of embodiments, the ratio may be used to compute a number of target cycles (referred to as ntarget or $n_{target}$) of the LPO clock that would be required to construct a specified number (K) cycles of an ideal clock of a specified frequency (e.g. a 3.20 kHz clock). The ideal (e.g. 3.20 kHz) clock would have a corresponding period (312.5 is for a 3.2 KHz clock), which may be half of a (Bluetooth) slot period.

The computation may be performed in software or hardware, or a combination of both, and ntarget may be computed to span a specified number (e.g. 128) cycles of the ideal (3.20 kHz) clock. This implies that there may be a corresponding number (in this case seven) of bits of fractional precision, which may be broken into two values, an integer component (referred to as ntarget_int or $n_{target}$ int) and a fractional component (ntarget_frac or $n_{target}$ frac—it should be noted here that the notations ntarget and $n_{target}$ and the like are used interchangeably herein). Each period of the ideal (3.20 KHz) clock, cycles of the LPO clock output may be counted until the count reaches a threshold based on the ratio of the number of high-speed clock cycles and the number of LPO clock cycles. The threshold may be defined as either ntarget_int or ntarget_int+1, with the higher threshold ntarget_int+1 chosen a specified fraction of the time, the fraction defined as ntarget_frac/128. In this way, a dithered clock of specified frequency (e.g. a 3.2 kHz clock) may be generated. However when using only a single LPO, the accuracy of the system may be limited by the accuracy of the LPO, which may fall outside the required 250 ppm accuracy in sleep mode, due to varying voltage, temperature, and/or other factors.

In order to increase accuracy without increasing power consumption, a dual-LPO system may be created. One embodiment of such a system is shown in FIG. 4, with a more detailed diagram shown in FIG. 7. In system 700, LPOs 708 and 724 may be physically located adjacent to one another. LPO1 708 may be configured to produce a clock output of a first specified frequency (or period of oscillation), e.g. 1 MHz, while LPO2 724 may be configured to produce a clock output of a second specified frequency, which may be greater than the first specified frequency, e.g. 2 MHz. System 700 may be configured with any two LPOs as long as the difference between the periods of oscillation of the two LPOs remains substantially constant, or within a specified allowed range, with changes in temperature and supply voltage. In other words, if the period of LPO1 is referred to as T1, the period of LPO2 is referred to as T2, and the difference between T1 and T2 is referred to as ΔT, in system 700, (T1−T2)=ΔT even as temperature and voltage conditions change. This feature may be used to allow one LPO to correct the other LPO while conditions vary, or it may be used in a variety of other ways to generate a substantially stable desired final output clock. For example, cycles of a periodic signal generated by one LPO may be counted to generate the final output clock, and the count may be adjusted using the other LPO. Overall, the respective clock outputs generated by LPO1 708 and LPO2 724 may be provided to a control circuit 701, which may be configured to generate a stable Final Clock signal using ΔT, based on the respective output of one of LPO1 708 and LPO2 724. In a functional sense, if the output of LPO1 increases in frequency, the frequency of the output of LPO2 may increase even more, by roughly a fixed ratio. The same may be true as the frequency of the output of LPO1 and the output of LPO2 decrease. In both cases, the respective outputs of the LPOs may remain locked together in the way described above. In one set of embodiments, LPO1 708 may be LPO 100 (from FIG. 1), and LPO2 724 may be LPO 200 (from FIG. 2), with the respective frequencies of the two LPOs determined as previously explained with respect to FIGS. 1, 2, 3, 5A/B and 6A/B.

As previously mentioned, prior to entering sleep mode, the system may initiate a calibration of the LPO frequency using a high-speed clock, e.g. a 96 MHz clock. In system 700, this may be take place in the calibration of LPO1 708 and LPO2 724. During calibration, cycles of the high-speed (e.g. 96 MHz) clock may be counted by counter 712 and counter 726 for a fixed number of cycles of LPO1 708 and LPO2 724, respectively, and stored to a register or respective registers. In one set of embodiments, the cycles of the high-speed clock may be counted by the faster LPO until the slower LPO reaches a specified count. The ratio of the number of respective high-speed clock cycles and the number of respective corresponding LPO1 and LPO2 clock cycles may be used to determine the frequency of the of the clock output of LPO1 and the frequency of the of the clock output of LPO2. Specifically, the ratio may be used to compute the number of target cycles $n_{1target}$ for LPO1 708 and $n_{2target}$ for LPO2 724, to construct a specified number (K) cycles of an ideal clock of a specified frequency (e.g. a 3.20 kHz clock).

Thus, the computation may span the specified number K (e.g. 128) cycles of the ideal (3.20 kHz) clock. A corresponding number (in case of K=128, the number is 7) of bits of fractional precision may be broken into respective two values corresponding to each LPO, an integer component ($n_{1target\_int}$ 702 and $n_{2target\_int}$ 718) and a fractional component ($n_{1target\_frac}$ and $n_{2target\_frac}$). For each period of the desired low-frequency clock, cycles of the LPO1 clock output may be counted until the count reaches a threshold based on the ratio of $n_{1target}/K$ (which is equivalent to $n_{1target\_frac}$), and cycles of the LPO2 clock output may be counted until the count reaches a threshold based on the ratio of $n_{2target}/K$ (which is equivalent to $n_{2target\_frac}$), using respective comparators 714 and 727. Fractional counters 706 and 722 may be used to specify which threshold is used, $n_{1target\_int}$ and $n_{2target\_int}$ or $n_{1target\_int}+1$ and $n_{2target\_int}+1$. Each time counter 712 reaches $n_{1target\_int}$ or $n_{1target\_int}+1$ (if '1' is added to $n_{1target\_int}$ at the time), and counter 726 reaches $n_{2target\_int}$ or $n_{2target\_int}+1$ (if '1' is added to $n_{2target\_int}$ at the time), fractional counters 706 and 722, respectively, step to the next bit, corresponding to $n_{1target\_frac}$ (i.e. $n_{1target}/K$) for LPO1 708 and $n_{2target\_frac}$ (i.e. $n_{2target}/K$) for LPO2 724. Each time fractional counters 706 and 722 step to the next bit, they may also operate to add '1' to $n_{1target\_int}$ and $n_{2target\_int}$ if '1' is to be added as determined according to $n_{1target\_frac}$ and $n_{2target\_frac}$, respectively. A (dithered) desired low-frequency clock may thereby be generated, with the period of oscillation of the low-frequency clock defining how many cycles of LPO1 708 are counted before resetting counter 712, and how many cycles of LPO2 724 are counted before resetting counter 726. In the embodiment shown in FIG. 7, each time the required count is reached, the output of comparator 727 may be flipped, and counter 726 may be reset, thereby obtaining final clock at the output of comparator 727. When fractional counter 722 reaches a specified value (e.g. K), indicating that n2 has reached $n_{2target}$, fractional counter 722 may assert a signal to control block 716 to indicate that n2 has reached $n_{2target}$.

Operation During Sleep Mode

The dual-LPO system 700 may also be operated during sleep mode. During sleep mode, n1 may be accumulated until n2 reaches $n_{2target}$. Once n2 reaches $n_{2target}$, the difference $\Delta n_1$ between n1 and $n_{1target}$ may be obtained:

$$\Delta n_1 = n1 - n_{1target} \quad (15)$$

Again, it should be noted that $n_{1target}$ refers to the number of cycles of LPO1 that it may take to count K (e.g. 128) cycles of a specified 'ideal' low-frequency clock, e.g. 3.2 KHz clock, when conditions are the same as when LPO1 was calibrated or when LPO1 was cross-calibrated. However, if conditions change, the number of cycles it takes to count K cycles of the specified clock may actually be different. Similarly, $n_{2target}$ refers to the number of cycles of LPO2 that it may take to count K cycles of the specified 'ideal' low-frequency clock, when conditions are the same as when LPO2 was calibrated or when LPO2 was cross-calibrated. As previously noted, in one embodiment, LPO1 may be configured to produce a 1 MHz clock and LPO2 may be configured to produce a 2 MHz clock. Then, if for example the frequency of the clock output of LPO1 changes by 1%, the frequency of the clock output of LPO2 may change by 2%, when ΔT remains substantially constant. The values of $n_{1target}$ and $n_{2target}$ may represent the number of cycles it takes to count to a specified time period defined as the multiple of K and the period of the low-frequency clock (e.g. 40 msec=K*1/3.2 KHz). If conditions don't change, n1 may reach $n_{1target}$ at the same time n2 reaches $n_{2target}$. However, if conditions change, for example because of temperature changes or changes in supply voltage, the present values of $n_{1target}$ and/or $n_{2target}$ may no longer be accurate. There may be a difference, $\Delta n_1$, as n2 reaches $n_{2target}$ before or after n1 reaches $n_{1target}$, expressed in equation (15) above.

Thus, new values of $n_{1target}$ and $n_{2target}$ may be computed/determined according to the following equations, using a specified number of fractional bits (referred to as $\Delta n\_mult\_bits$), which in this case may be set to 4 ($\Delta n\_mult\_bits=4$):

$$n_{1target} = \text{floor}(n_{1target} + \Delta n_1 * \Delta n_{1\_mult} * 2^{-\Delta n\_mult\_bits} + 0.5), \quad (16)$$

$$n_{2target} = \text{floor}(n_{2target} + \Delta n_1 * \Delta n_{2\_mult} * 2^{-\Delta n\_mult\_bits} + 0.5). \quad (17)$$

$\Delta n_1\_mult$ and $\Delta n_2\_mult$ may be computed values (computed multipliers), used to compute the new $n_{1target}$ and new $n_{2target}$ values to be used in the future (as will be further elaborated upon in the Initial Calibration section below). Computation of these new target values may be performed while counters 712 and 726 are running, with the counters reset (e.g. to 0) and counting restarted for a new sequence of K periods of the low-frequency clock (e.g. period of 312.5 μs). The computation of $\Delta n_1$, $n_{1target}$ and $n_{2target}$ may occur in parallel with full dual-LPO operation, and new values may be ready by the end of the first period of the low-frequency clock. When assuming at least a 1 MHz clock for the slower of the LPO clocks (e.g. for LPO1 708), at least 312 cycles may be available for this computation. That is, every time K cycles of the low-frequency clock have been counted, $\Delta n_1$ may be re-measured, and $n_{1target}$ and $n_{2target}$ may be recomputed based on $\Delta n_1$, $\Delta n_1\_mult$, and $\Delta n_2\_mult$.

By default, seven fractional bits may be used for $n_{1target}$ and $n_{2target}$, and these targets may be updated every K (e.g. 128) cycles of the low-frequency (e.g. 3.2 KHz) clock. The value of K may be determined based on the desired timing accuracy in view of the respective frequencies of LPO1 708, LPO2 724, the high-frequency clock (which was designated as 96 MHz in the discussed embodiments), and the low-frequency clock (which was designated as 3.2 KHz in the discussed embodiments). For example, for the discussed embodiments, values other than 128 may be used, if more accurate timing is required for more fractional bits, or if faster updating is required. Values of 16 to 256 may be supported (4 to 8 fractional bits).

Quick Correction

In some embodiments, dual-LPO system 700 may be configured with the capacity to perform a quick correction when desired. A step function in the LPO frequency may be possible when entering sleep mode. If the voltage supplied to the LPOs (LPO1 708 and/or LPO2 724) in sleep mode is different from the voltage supplied to the LPOs during normal operational mode, the calibration value may be incorrect. In order to compensate for this, a quicker step may be required initially, followed by longer steps. For example, initially, a smaller number than K (e.g. only 16) cycles of the low-frequency (e.g. 3.2 KHz) clock may be counted before updating $n_{1target}$ and $n_{2target}$, which, additionally, may be updated up to the first 4 MSBs (most significant bits) of the fractional part, instead of up to the full specified number of bits (e.g. 7 bits in the discussed embodiments). Once the initial update is complete, the logic may return to the full specified number (e.g. 7 in the discussed embodiments) fractional bits, updating $n_{1target}$ and $n_{2target}$ every K cycles. In one set of embodiments, the value of K may be chosen depending upon the gradient of the change in LPO frequency before entering and after exiting sleep mode.

Exceeding Limits

Upper and lower thresholds may be set for $n_{2target}$, and if $n_{2target}$ ever exceeds either of these thresholds due to the cross-calibrated values, an interrupt may be asserted to wake the host system (not shown) in which dual-LPO system 700 is configured, e.g. by waking the processor or central processing unit of the host system, and effect a recalibration. This may be necessary because the linear values of $\Delta n_1\_mult$ and $\Delta n_2\_mult$ may only be accurate for a small range around the calibrated value. $\Delta T$ may also only be accurate within the specified ppm tolerance (e.g. 250 ppm) for a given range of temperature and voltage variations. Furthermore, the linear values $\Delta n_1\_mult$ and $\Delta n_2\_mult$ may only be linear approximations of a convex curve. Due to these reasons, a new calibration may begin once the target count values have deviated by more than a specified amount from the calibration value. For example, in one embodiment, when $n_{2target}$ needs to be adjusted by more than 1% of its initially calibrated value, the sleep mechanism may be configured to wake up the host system, and request a recalibration. This may occur when the temperature changes drastically, for example. In one set of embodiments, the threshold values for $n_{1target}$ and $n_{2target}$ may be set by software executing on the processor or central processing unit of the host system.

LPO Switching Capability

Figure 7:
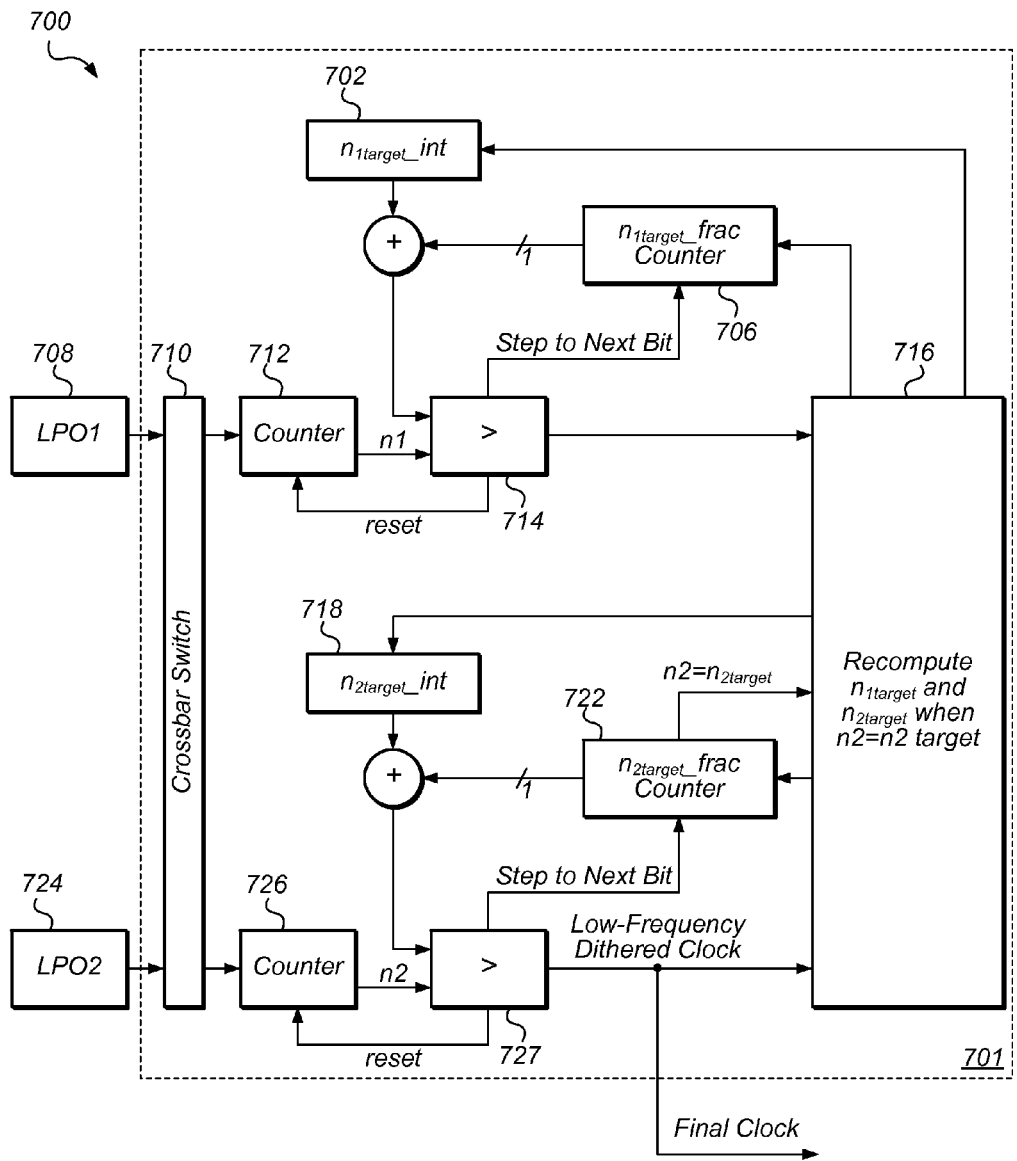
FIG. 7 shows a more detailed diagram of the embodiment of the two-oscillator system of FIG. 4.

Dual-LPO system 700 may be configured with the capability to select which LPO is designated as the primary LPO from which the final clock output may be obtained, and utilize the other LPO as the calibrating LPO. In one set of embodiments, this may be accomplished using crossbar switch 710 as shown in FIG. 7. Using crossbar switch 710, the output of LPO1 708 may be switched to either one of counter 712 and counter 726, and similarly, the output of LPO2 724 may be switched to either one of counter 726 and counter 712, respectively. For example, when the output of LPO1 708 is switched to counter 726, the output of LPO2 724 may be switched to counter 712, resulting in the final clock output being provided by LPO1 708, as calibrated by LPO2 724. There may advantages to using either the faster or slower LPO as the primary LPO for clock generation. The faster LPO may have finer time steps, making it possibly to use the faster LPO to more accurately create the low-frequency clock with less jitter. However, the slower LPO may vary by fewer ppm than the faster LPO for a given change in temperature and/or supply voltage. That is, the output frequency of the slower LPO may drift less with variations in temperature and/or supply voltage, making the slower LPO a better choice for maintaining an accurate clock in varying conditions.

Initial Calibration

As previously mentioned, calibrations may be performed on both LPO1 708 and LPO2 724 prior to entering sleep mode. The high-frequency clock (e.g. 96 MHz clock) may be counted for a fixed number (L) of cycles of the respective clock outputs of both LPO1 and LPO2. Based on these counts, values of $n_{1target}$ and $n_{2target}$ may be computed, with a specified number (e.g. 7) of bits of fractional precision. These values of $n_{1target}$ and $n_{2target}$ represent the ideal number of cycles of LPO1 and LPO2 that may be required to reach the period (e.g. 312.5 μs) of the desired low-frequency clock. Two other values to support cross-calibration (which may be hardware based) may also be computed: $\Delta n_1\_mult$ and $\Delta n_2\_mult$. These values may be used while in sleep mode to create new values of $n_{1target}$ and $n_{2target}$ based on the difference ($\Delta n_1$) between n1 and $n_{1target}$.

The first step may be to determine the change in period ($\Delta T$) that has occurred, based on the difference $\Delta n_1$ between $n_{1target}$ and n1 when $n_{2target}$=n2, assuming that n2 reaches $n_{2target}$ before n1 reaches $n_{2target}$ due to varying temperatures and/or supply voltage (and/or any additional factors that may result in a drift in frequency of the LPO outputs). The set of equations (18) shows how $\Delta T$ may be obtained. As indicated in the first line of equations (18), after calibration, $n_{1target}T_1=n_{2target}T_2$, where $T_1$ refers to the period of oscillation of LPO1 and $T_2$ refers to the period of oscillation of LPO2. Assuming that $T_2$ has changed by $\Delta T$, and $n_{2target}$ cycles of the clock output of LPO2 have been counted, due to the respective properties of the two LPOs $\Delta T$ may be the same for both LPOs (for an example of how this may be achieved, see FIGS. 1-3 and the corresponding description for possible LPO structures). Accordingly, there will be a change in the frequency (or period) of oscillation of LPO1, and the difference ($\Delta n_1$) between $n_{1target}$ and the actual counted number of cycles of the clock output of LPO1 may be measured. Thus, simple operations may be performed to derive an equation for $\Delta T$. Once $\Delta T$ is known, new ideal values for $T_1$ and $T_2$, and thus for $n_{1target}$ and $n_{2target}$ may be computed. Assuming a $\Delta T$ value for a given value of $\Delta n_1$, (i.e., $\Delta n_1$ corresponding to a given value of $\Delta T$), through a linear approximation, a multiplier may be created for modifying $n_{1target}$ and $n_{2target}$ based on these values.

$$(n_{1target})(T_1) = T_{period} = (n_{2target})(T_2) \quad (18)$$

$$(n_{1target} + \Delta n_1)(T_1 + \Delta T) = (n_{2target})(T_2 + \Delta T)$$

$$n_{1target}T_1 + n_{1target}\Delta T + \Delta n_1 T_1 + \Delta n_1 \Delta T =$$

$$n_{2target}T_2 + n_{2target}\Delta T$$

$$n_{1target}\Delta T + \Delta n_1 T_1 + \Delta n_1 \Delta T = n_{2target}\Delta T$$

$$\Delta T(n_{1target} + \Delta n_1 - n_{2target}) = -\Delta n_1 T_1$$

$$\Delta T = \frac{-\Delta n_1 T_1}{n_{1target} + \Delta n_1 - n_{2target}}$$

Figure 8:
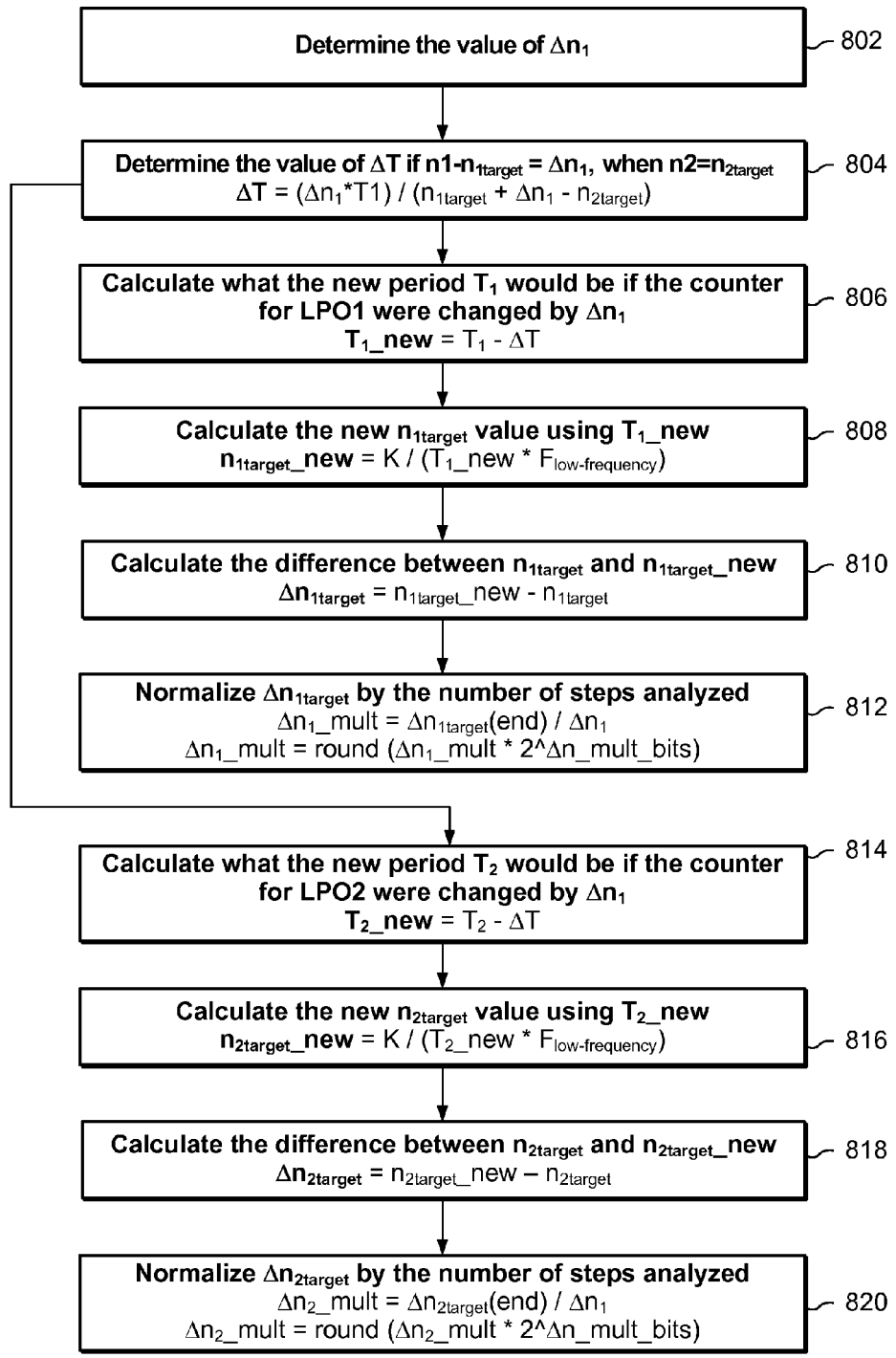
FIG. 8 shows a flow diagram of one embodiment of a sequence of calculations.

FIG. 8 shows a flow diagram of one embodiment of the sequence of calculations performed to obtain the values for $\Delta n_1\_mult$ and $\Delta n_2\_mult$ that may be used to modify $n_{1target}$ and $n_{2target}$. In 802, the value of $\Delta n_1$ may be determined based on the difference between the current value of n1 and $n_{1target}$. In 804, the value of $\Delta T$ may be determined based on $\Delta n_1$ (i.e. if $n_1-n_{1target}=\Delta n_1$, when $n2=n_{2target}$). Subsequently, the respective new period ($T_1\_new$ and $T_2\_new$, respectively) may be calculated for both LPO1 and LPO2 from the current period ($T_1$ and $T_2$, respectively) using the value of $\Delta T$, as indicated in 806 (for LPO1) and 814 (for LPO2). The new periods of oscillation ($T_1$ new and $T_2\_new$) may then be used to calculate the new target values ($n_{1target}\_new$ and $n_{2target}\_new$, respectively) for both LPO1 and LPO2, using the frequency value of the desired low-frequency clock to be generated (referenced in FIG. 8 as $F_{low-frequency}$) and the specified number (L) of cycles to be counted for each LPO, as indicated in 808 (for LPO1) and 816 (LPO2). The difference between $n_{1target}\_new$ and $n_{1target}$ (in 810) and the difference between $n_{2target}\_new$ and $n_{2target}$ (in 818) may then be obtained, and normalized by the number of steps analyzed, obtaining $\Delta n_1\_mult$ as indicated in 812 (for LPO1) and obtaining $\Delta n_2\_mult$ as indicated in 820 (for LPO2). The $n_{1target}$ and $n_{2target}$ values may then be recomputed when $n2=n_{2target}$, using the obtained $\Delta n_1\_mult$ and $\Delta n_2\_mult$ values as shown in equations (16) and (17), to correct the final (dithered) clock output shown in FIG. 7.

It should be noted, that $\Delta n_1\_mult$ and $\Delta n_2\_mult$ may also be modified to account for small actual changes in $\Delta T$. In other words, while $\Delta T$ may be expected to remain substantially constant over changes in temperature and/or supply voltage, it may under some conditions change by a small, albeit predictable amount. Thus, two modifiers, $\Delta n_1\_mult\_mod$ and $\Delta n_2\_mult\_mod$ may be obtained to adjust $\Delta n_1\_mult$ and $\Delta n_2\_mult$, respectively, when the change in $\Delta T$ is consistent. In such cases, the temperature of the system may be obtained, e.g. by taking on-chip temperature measurements, and $\Delta n_1\_mult$ and $\Delta n_2\_mult$ may be adjusted accordingly, to take into account the predictable change in $\Delta T$.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system comprising:
a first circuit configured to generate a first clock having a first period of oscillation;
a second circuit configured to generate a second clock having a second period of oscillation, wherein a difference ($\Delta T$) between the first period of oscillation and the second period of oscillation remains within a specified limit even during variations in temperature and/or during variations in the supply voltage of the system; and
a control circuit configured to receive the first clock and the second clock, and further configured to:
adjust, according to $\Delta T$, a first target parameter corresponding to a first number of cycles of the first clock, when a current cycle count of the second clock reaches a second target parameter corresponding to a second number of cycles of the second clock;
adjust, according to $\Delta T$, the second target parameter, when the current cycle count of the second clock reaches the second target parameter; and
generate an output clock having an output period higher than the first period and the second period, based on the second target parameter and counted cycles of one of:
the second clock; and
the first clock.

2. The system of claim 1, wherein the first period is higher than the second period.

3. The system of claim 1, wherein the first circuit is a first low-power oscillator and the second circuit is a second low-power oscillator.

4. The system of claim 1, wherein the control circuit is further configured to perform an initial calibration to determine an initial value of the first period of oscillation and an initial value of the second period of oscillation, while the system is in normal operating mode.

5. The system of claim 4, wherein the control circuit is configured to:
determine the initial value of the first period of oscillation by counting cycles of a high-speed clock for a specified number of cycles of the first clock to obtain a first cycle count;
determine the initial value of the second period of oscillation by counting cycles of the high-speed clock for a specified number of cycles of the second clock to obtain a second cycle count;
wherein the high-speed clock has a higher frequency than the first clock and the second clock;
wherein the initial value of the first period of oscillation is given by the first cycle count divided by the specified number of cycles of the first clock; and
wherein the initial value of the second period of oscillation is given by the second cycle count divided by the specified number of cycles of the second clock.

6. The system of claim 1, wherein the control circuit is further configured to adjust the first target parameter and the second target parameter while the system is in sleep mode with the exception of the first circuit, the second circuit, and the control circuit.

7. The system of claim 1, wherein the control circuit comprises:
a first counter configured to count cycles of the second clock until a specified number of cycles of the second clock is reached; and
a first output circuit configured to flip its output and reset the first counter each time the specified number of cycles of the second clock is reached;
wherein the output of the first output circuit is configured as the output clock.

8. The system of claim 7, wherein the control circuit further comprises:
a second counter configured to count cycles of the first clock until a specified number of cycles of the first clock is reached; and
a second output circuit configured to flip its output and reset the second counter each time the specified number of cycles of the first clock is reached.

9. A method comprising:
generating a first clock having a first period of oscillation;
generating a second clock having a second period of oscillation;
counting cycles of the first clock and the second clock;
determining a difference ($\Delta T$) between the first period of oscillation and the second period of oscillation, wherein $\Delta T$ remains within a specified limit even during variations in temperature and/or during variations in the supply voltage of the system;

adjusting, according to ΔT, a first target parameter corresponding to a first number of cycles of the first clock in response to said counting resulting in a current cycle count of the first clock reaching the first target parameter; and generating, based on counted cycles of the first clock, an output clock having an output period defined by the first target parameter divided by a specified number (K).

10. The method of claim 9, further comprising:

adjusting, according to ΔT, a second target parameter corresponding to a second number of cycles of the second clock in response to said counting resulting in the current cycle count of the first clock reaching the first target parameter.

11. The method of claim 10, wherein said determining ΔT comprises determining a difference value indicative of a difference between the second target parameter and a current cycle count of the second clock when the current cycle count of the first clock reaches the first target parameter.

12. The method of claim 11, wherein said determining ΔT comprises calculating ΔT from the difference value, the second period of oscillation, the first target parameter, and the second target parameter.

13. The method of claim 11, further comprising:

multiplying the difference value by a first factor to obtain a first value;

wherein said adjusting the first target parameter comprises adding the first value to the first target parameter.

14. The method of claim 13, further comprising calculating the first factor based on the first period, the first target parameter, and the output period.

15. The method of claim 14, wherein said calculating the first factor comprises setting a new value of the first period to a present value of the first period minus ΔT.

16. The method of claim 15, wherein said calculating the first factor further comprises updating the first target value using the new value of the first period.

17. The method of claim 16, wherein said calculating the first factor further comprises calculating a difference between the first target value and the updated first target value.

18. The method of claim 17, wherein said calculating the first factor further comprises normalizing the difference between the first target value and the updated first target value by a number of steps analyzed, to obtain the first factor.

19. The method of claim 9, wherein said generating the output clock comprises:

(a) counting cycles of the first clock until a specified number of cycles of the first clock is reached;

(b) changing a logic level of the output clock in response to reaching the specified number of cycles of the first clock; and performing (a) and (b) in sequence a plurality of times.

20. The method of claim 19, wherein the specified number of cycles is defined by the first target value, the output period, and a specified fractional precision.

* * * * *